(12) United States Patent
Watkowski et al.

(10) Patent No.: US 7,575,666 B2
(45) Date of Patent: Aug. 18, 2009

(54) PROCESS FOR ELECTROLYTICALLY PLATING COPPER

(76) Inventors: James Watkowski, 100 Ravenwood Dr., Middlebury, CT (US) 06762; Maria Nikolova, 48 Craftwood Rd., Apt. 5E, Waterbury, CT (US) 06704

( * ) Notice: Subject to any disclaimer, the term of this patent is extended or adjusted under 35 U.S.C. 154(b) by 169 days.

(21) Appl. No.: 11/398,048

(22) Filed: Apr. 5, 2006

(65) Prior Publication Data

US 2007/0235343 A1  Oct. 11, 2007

(51) Int. Cl.
*C25D 3/38* (2006.01)
*C25D 5/34* (2006.01)

(52) U.S. Cl. ........................ 205/291; 205/210

(58) Field of Classification Search .......... 205/210, 205/291
See application file for complete search history.

(56) References Cited

U.S. PATENT DOCUMENTS

| | | | | |
|---|---|---|---|---|
| 2,525,943 A | * | 10/1950 | Proell | 205/296 |
| 3,775,176 A | * | 11/1973 | Cross et al. | 427/353 |
| 4,038,042 A | * | 7/1977 | Adelman | 428/625 |
| 4,954,226 A | * | 9/1990 | Mahmoud | 205/125 |
| 5,051,154 A | | 9/1991 | Bernards et al. | |
| 5,068,013 A | | 11/1991 | Bernards et al. | |
| 5,174,886 A | | 12/1992 | King et al. | |
| 5,616,230 A | * | 4/1997 | Otsuka et al. | 205/125 |
| 5,888,372 A | * | 3/1999 | Bollens et al. | 205/159 |
| 5,908,543 A | * | 6/1999 | Matsunami et al. | 205/159 |
| 6,605,204 B1 | | 8/2003 | Martyak et al. | |
| 6,638,411 B1 | * | 10/2003 | Mishima et al. | 205/210 |
| 6,770,558 B2 | | 8/2004 | Delamarche et al. | |
| 2001/0013472 A1 | * | 8/2001 | Nakamura et al. | 205/103 |
| 2002/0064591 A1 | * | 5/2002 | Hongo et al. | 427/96 |
| 2003/0010646 A1 | * | 1/2003 | Barstad et al. | 205/291 |
| 2004/0045832 A1 | | 3/2004 | Martyak | |
| 2004/0104117 A1 | * | 6/2004 | Yang et al. | 205/76 |
| 2004/0231998 A1 | | 11/2004 | Josell et al. | |
| 2005/0184369 A1 | * | 8/2005 | Sonoda et al. | 257/677 |
| 2005/0274622 A1 | * | 12/2005 | Sun et al. | 205/209 |

FOREIGN PATENT DOCUMENTS

| | | | |
|---|---|---|---|
| JP | 07157890 A | * | 6/1995 |
| WO | WO 2004/016829 A2 | | 2/2004 |
| WO | WO 2004/011698 A1 | * | 5/2004 |

* cited by examiner

*Primary Examiner*—Nam X Nguyen
*Assistant Examiner*—Dustin Q Dam
(74) *Attorney, Agent, or Firm*—Carmody & Torrance LLP

(57) ABSTRACT

An electrolytic copper plating process comprising two steps is proposed. The process is particularly suited to plating in very confined spaces. The first step comprises a pre-treatment solution comprising an anti-suppressor that comprises a sulfur containing organic compound, preferably incorporating an alkane sulfonate group or groups and/or an alkane sulfonic acid. The second step comprises an electrolytic copper plating solution based on an alkane sulfonic acid.

9 Claims, No Drawings

PROCESS FOR ELECTROLYTICALLY PLATING COPPER

BACKGROUND OF THE INVENTION

This invention relates to a process for electrolytically plating copper onto surfaces, particularly for electroplating in very confined areas such as through-holes or vias on printed circuit boards. The process of the invention is particularly suited to plating very small printed circuit vias.

Electrolytic copper plating is a process which deposits copper on conductive substrates using an external electric current. Widely known commercial electrolytic copper plating solutions include aqueous solutions of copper sulfate, copper fluorborate or copper cyanide along with various additives that improve the properties of the copper deposit. The most widely used commercial copper plating electrolyte is based on an aqueous solution of copper sulfate, sulfuric acid and various plating additives. Regarding copper electrolytic plating baths and additives in general, please refer to U.S. Pat. Nos. 5,068,013; 5,174,886; and 5,051,154; the teachings each of which are incorporated herein by reference in their entirety.

The use of alkane sulfonic acids in electrolytic copper plating is also known. U.S. Pat. No. 6,605,204, the teachings of which are incorporated by reference herein in their entirety, discusses the electrolytic deposition of copper onto electronic devices using a solution comprising copper alkane sulfonate salts and free alkane sulfonic acids.

Miniaturization and increased functionality demands have substantially decreased the sizes of electronic features that need to be plated. For instance, many circuit board designs require the effective plating of blind vias with diameters in the range of about 25 to about 250 microns, with an aspect ratio in the range of about 1:1 up to about 1.5:1, and simultaneously plating though holes with an aspect ratio of up to about 8:1. Many electrolytic copper plating baths are not capable of plating in such confined spaces. In some cases wettability is a problem, in other cases mass transport presents issues and in other areas electrical effects cause difficulties. Historically, the reliability of simultaneously plated though holes, incorporated with mixed technology designs, has not been able to meet industry specifications.

As a result, a need remains for an electrolytic copper plating solution and process which is capable of effectively plating in confined spaces. The electrolytic copper plating solution and process proposed herein are particularly designed and suited for electronic applications where effective plating is required in confined spaces.

SUMMARY OF INVENTION

The inventors herein propose an electrolytic copper plating process comprising:
1. Contacting a surface with a pre-treatment solution comprising an aqueous solution of an anti-suppressor for copper electrochemical reduction. The anti-suppressor is a sulfur containing organic compound, preferably comprising an alkane sulfonate group and/or an alkane sulfonic acid; and then
2. Contacting said surface as a cathode with an electrolytic copper plating solution and applying a plating current such that copper is plated on the surface. The electrolytic copper plating solution comprises of (i) copper ions and (ii) an alkane sulfonic acid, (iii) chloride ions, and preferably (iv) an aldehyde or ketone compound.

Preferably, the electrolytic copper plating solution also comprises (i) a surfactant or wetter, (ii) a brightener comprising a sulfur containing organic compound preferably incorporating a sulfonate group or groups, and (iii) a leveling agent comprising nitrogen containing organic compounds.

DETAILED DESCRIPTION OF THE INVENTION

A process for electrolytically plating copper comprising a pre-treatment step and a plating step is proposed. The process is particularly suited to plating in very confined spaces such as micro-vias on printed circuit boards and for simultaneously plating through holes in the same board design. The proposed process comprises:
1. Contacting a surface with a pre-treatment solution comprising an aqueous solution of an anti-suppressor, wherein the anti-suppressor comprises a sulfur containing organic compound preferably incorporating an (alkane) sulfonate group or groups and/or an alkane sulfonic acid; and then
2. Contacting said surface as a cathode with an electrolytic copper plating solution comprising (i) copper ions and (ii) an alkane sulfonic acid, (iii) chloride ions, and preferably (iv) an aldehyde or ketone compound; and applying a plating current such that copper is plated on the surface.

The pre-treatment solution comprises an anti-suppressor for copper electrochemical reduction that comprises a sulfur containing organic compound, preferably comprising an (alkane) sulfonate group or groups and/or an (alkane) sulfonic acid. Examples of compounds that are suitable for use as anti-suppressors in the pre-treatment solution include without limitation disodium 4,5-dithiooctane-1, 8-disulfonate, sodium 2-mercapto-ethane sulfonate, potassium 3-mercapto-1-propane sulfonate, disodium bis-(3-sulfopropyl) disulfide, disodium bis(3-sulfopropyl) disulfide tetrapolypropoxy ethoxy ethylene diamine sulfosuccinic ester sodium salt, or mixtures thereof. Preferably, the pre-treatment solution anti-suppressor is disodium bis(3-sulfopropyl) disulfide. The concentration of the anti-suppressor in the pre-treatment solution is preferably from about 0.1 g/l to about 10 g/l.

Optionally, but preferably the pre-treatment solution also comprises copper ions. The copper ions may be provided by copper sulfate, copper methane sulfonate or similar copper salts. Copper sulfate is a preferred source of copper ions. If used, the concentration of copper ions in the pre-treatment solution is preferably from about 0.01 to about 5.0 g/l. In any case the pH of the pre-treatment solution is preferably in the range 1.0-3.5.

The electrolytic plating solution, which follows the pre-treatment solution, comprises an aqueous solution of (i) copper ions and (ii) alkane sulfonic acid, (iii) chloride ions, and preferably (iv) an aldehyde or ketone compound. The plating bath also preferably comprises (i) surfactant or wetter, (ii) a brightener additive and (iii) a leveling additive.

The source of copper ions in the electrolytic copper plating solution can be from copper sulfate, copper oxide, copper methane sulfonate or similar copper salts. Preferably, copper methane sulfonate or copper oxide (dissolved in alkane sulfonic acid) are used. The concentration of copper ions in the plating solution is preferably from about 20 to 60 g/l and more preferably from 40 to 55 g/l.

The alkane sulfonic acid used in the plating solution is preferably methane sulfonic acid due to its relative low cost. The concentration of alkane sulfonic acid in the plating solution is preferably from about 40 to about 200 g/l.

The sources of chloride ion include chloride salts that are soluble in the electroplating solution. Examples of chloride ion sources are sodium chloride, potassium chloride, hydrochloric acid, or mixture thereof. The chloride ion concentration preferably ranges from 0.02 ppm to 125 ppm, preferably from 30 ppm to 90 ppm.

Examples of the aldehyde or ketone compound that is preferably included in the copper electroplating solution include formaldehyde, acetaldehyde, succinaldehyde, and methylethylketone, or mixture thereof. The concentration of these compounds is preferably in the range from about 0.005 to about 0.500 g/l.

The plating solution preferably also comprises a surfactant or a wetter. The surfactant or wetter is used to lower the surface tension of the plating solution. This may be particularly important in allowing the plating solution to wet very small holes or vias. Useful surfactants or wetters include high molecular weight polymers, preferably polyglycol type polymers and co-polymers. Preferably poly(ethylene glycol), poly(propylene glycol) and copolymers thereof are used. The concentration of surfactants and/or wetters in the plating solution may range from about 0.1 to about 8 g/l.

The plating solution preferably comprises a brightener additive. In general brightener additives for copper electroplating are sulfur containing organic compounds and may also incorporate other functional groups. Examples include sodium 3-(benzthiazolyl-2-thio)-propylsulfonate; sodium ethylene-dithiodipropylsulfonate; disodium bis-(3-sulfopropyl) disulfide; N,N-dimethyldithiocarbamic acid (3-sulfopopyl) ester sodium salt; or mixtures thereof. Preferably the brightener additive comprises disodium bis-(3-sulfopropyl) disulfide. The concentration of brightener additive in the plating solution is preferably from about 0.001 ppm to about 2.00 ppm.

The plating solution also preferably comprises a leveling additive. Leveling additives for copper electroplating generally comprise nitrogen containing organic compounds. Compounds with an amino group or substituted amino groups are commonly used. Examples include polymeric amines; triisopropanolamine, alkylated polyalkyleneimine; and 4-mecaptopyridine. Preferably the leveling additive is tetrapolypropoxy-ethoxy ethylenediamine sulfosuccinic ester sodium salt. The concentration of the leveling additive in the plating solution is preferably from about 0.005 to about 0.100 g/l.

The surface to be plated is placed in the electrolytic copper plating solution and connected to the negative pole of a current source, thereby making it a chathode. Metallic copper anodes are also placed in the plating solution and connected to the positive pole of a current source. The resulting plating current causes copper to plate on the surface. The method described herein allows for utilizing direct current (DC), pulse periodic current (PP), periodic pulse reverse current (PPR), and/or combinations of them though out the plating cycle.

The amperes used in the plating current may be constant or may be varied as in pulse plating. Generally the cathode current densities useful in this plating solution range from 5 to 30 amperes per square foot of cathode area, preferably the cathode current densities range from 8 to 15 amperes per square foot of cathode area.

EXAMPLE I

The following pre-treatment and plating solutions were prepared:

| Pre-Treatment | |
| --- | --- |
| Component | Concentration |
| Disodium bis-(3-sulfopropyl)disulfide | 3 mmol/L (1.06 g/L) |
| Copper as sulfate | 10.6 mmol/L (0.67 g/L) |
| Water | up to 1 L |

| Plating Solution | |
| --- | --- |
| Component | Concentration |
| Copper as Copper Methane Sulfonate | 45 g/L |
| Methane Sulfonic Acid | 110 g/L |
| Chloride Ion | 65 ppm |
| Formaldehyde | 62 ppm |
| PEG 4000 Poly(ethylene glycol) | 1.1 g/l |
| Disodium bis(3-sulfopropyl)disulfide | 0.5 ppm |
| Tetra polypropoxy-ethoxy ethylenediamine Sulfosuccinic ester sodium salt | 27 ppm |

Two 1.6 mm thick printed circuit boards that incorporated vias of 50, 75, 100, and 150 micrometer diameter, 75 and 100 micrometer deep and though holes with diameters of 0.2, 0.25, 035, and 0.5 mm were processed. One was processed through the pre-treatment solution and through the plating solution. The other was processed only through the plating solution. In both cases PPR current was used at a forward cathode current density of 12 ASF and a reverse current density of 30 ASF (Amperes per Square Foot). All of the vias and through holes of the board processed through the pre-treatment solution were effectively plated while the vias of the board processed through only the plating solution were not.

We claim:

1. A process for electrolytically plating copper on a surface, said process comprising:
   a) contacting the surface with a pre-treatment solution comprising an aqueous solution comprising a sulfur containing organic compound and from about 0.01 to about 5 g/l of copper ions; and then
   b) contacting said surface as a cathode with an electrolytic copper plating solution comprising (i) copper ions, (ii) from about 40 to about 200 g/l of an alkane sulfonic acid; (iii) chloride ions, and (iv) an aldehyde or ketone compound; and applying a plating current such that copper is plated on the surface;
   wherein the pH of the pre-treatment solution is in the range of 1 to 3.5.

2. A process according to claim 1 wherein the sulfur containing organic compound comprises a sulfonate group or a sulfonic acid group.

3. A process according to claim 1 wherein the plating solution also comprises at least one additive selected from the group consisting of brightener additives, leveler additives, surfactants and wetters.

4. A process according to claim 3 wherein the brightener additives comprise disodium bis(3-sulfopropyl) disulfide and the leveler additives comprise tetrapolypropoxy-ethoxy ethylenediamine sulfosuccinic ester sodium salt.

5. A process according to any one of claim 1, 3, or 4, wherein the sulfur containing organic compound comprises disodium bis(3-sulfopropyl) disulfide.

6. A process according to claim 1 wherein the plating current is a constant direct current.

7. A process according to any one of claim 1, 2, 3, or 4, wherein the plating current varies over time.

8. A process according to claim 1 wherein the electrical polarity of the cathode is reversed periodically.

9. A process according to claim 1 wherein:
a) the pre-treatment solution comprises copper ions and disodium bis(3-sulfopropyl) disulfide; and
b) the plating solution comprises disodium bis(3-sulfopropyl) disulfide and tetrapolypropoxy ethoxy ethylene diamine sulfosuccinic ester sodium salt.

* * * * *